(12) United States Patent
Hall et al.

(10) Patent No.: US 9,820,398 B1
(45) Date of Patent: *Nov. 14, 2017

(54) MODULAR DOMESTIC APPLIANCE WITH ELECTRICALLY CONDUCTIVE MEMBERS

(71) Applicants: David R. Hall, Provo, UT (US);
Andrew Priddis, Mapleton, UT (US);
Joseph Blanch, Provo, UT (US)

(72) Inventors: David R. Hall, Provo, UT (US);
Andrew Priddis, Mapleton, UT (US);
Joseph Blanch, Provo, UT (US)

(*) Notice: Subject to any disclaimer, the term of this patent is extended or adjusted under 35 U.S.C. 154(b) by 0 days.

This patent is subject to a terminal disclaimer.

(21) Appl. No.: 15/286,876

(22) Filed: Oct. 6, 2016

(51) Int. Cl.
| | |
|---|---|
| H05K 7/00 | (2006.01) |
| H05K 5/02 | (2006.01) |
| H01R 24/22 | (2011.01) |
| H01R 24/30 | (2011.01) |
| H01R 13/15 | (2006.01) |
| H05K 5/00 | (2006.01) |
| H05B 6/66 | (2006.01) |
| F24C 7/10 | (2006.01) |
| H01R 103/00 | (2006.01) |

(52) U.S. Cl.
CPC ............ *H05K 5/0256* (2013.01); *F24C 7/10* (2013.01); *H01R 13/15* (2013.01); *H01R 24/22* (2013.01); *H01R 24/30* (2013.01); *H05B 6/66* (2013.01); *H05K 5/0021* (2013.01); *H05K 5/0204* (2013.01); *H05K 5/0247* (2013.01); *H01R 2103/00* (2013.01)

(58) Field of Classification Search
CPC .. H05K 5/0256; H05K 5/0021; H05K 5/0204; H05K 5/0247; H01R 2103/00; H01R 24/22; H01R 24/30; H01R 13/15; H05B 6/66; F24C 7/10

USPC .......................................................... 361/728
See application file for complete search history.

(56) References Cited

U.S. PATENT DOCUMENTS

| | | | | |
|---|---|---|---|---|
| 4,739,242 A * | 4/1988 | McCarty | ............... | H02J 7/0013 30/DIG. 1 |
| 5,780,792 A * | 7/1998 | Fritts | ...................... | H01H 9/226 200/50.02 |
| 6,686,841 B1 * | 2/2004 | Busch | ................ | G08B 13/1454 340/568.1 |
| 7,351,939 B2 * | 4/2008 | Boyle | .................. | A47J 37/0857 219/386 |
| 8,599,563 B2 * | 12/2013 | Liao | ...................... | H05K 5/0247 361/728 |
| 8,699,215 B2 * | 4/2014 | Whitt, III | .............. | G06F 1/1618 345/169 |

(Continued)

*Primary Examiner* — Hung S Bui (57) ABSTRACT

The invention is an apparatus comprising an electrically powered appliance with electrically conductive members mounted to the appliance that both support and supply electrical power to the appliance. The electrically conductive members comprise insulative housings with openings that fit over connectors attached to a wall. Both the housings and the connectors comprise electrical conductors. When the connectors are fitted inside the housings, the electrical conductors mate to provide electrical power to the appliance. Furthermore, the appliance is suspended from a wall to which the connectors are mounted. The appliance can be modular or have particular dimensions that allow it to function within an automated storage and retrieval system. Finally, the appliance may be fitted with an outlet to accommodate a detachable power cord.

19 Claims, 12 Drawing Sheets

(56) References Cited

U.S. PATENT DOCUMENTS 9,643,782 B1 * 5/2017 Hall ................ B65G 1/127
9,673,575 B1 * 6/2017 Hall ................ H01R 13/73

* cited by examiner

MODULAR DOMESTIC APPLIANCE WITH ELECTRICALLY CONDUCTIVE MEMBERS

CROSS-REFERENCES

Technical Field

This invention relates generally to the field of domestic appliances, and more specifically to modular domestic appliances with electrically conductive members.

BACKGROUND

A typical household utilizes numerous appliances for functioning in everyday life, and many of these appliances require electricity to operate. There are different ways to connect an appliance to electricity, but most electrical appliances come equipped with a power cord that is plugged into an outlet in order to receive the necessary power. Frequently, when an electrical appliance is not in use, the power cord is wrapped up, and the appliance is put away into some sort of storage area. However, this ordinary process has several disadvantages.

One disadvantage of this process is in the use of the power cord. Power cords lead to many inconveniences. For example, power cords typically come in fixed lengths. Some appliances, such as a microwave or a television, are installed and then rarely moved afterward. In these applications where the appliance will remain unmoved for extended periods of time, an outlet is often located adjacent to the appliance to supply the electricity, so the length of the power cord is not a problem. However, when the user wants to move the appliance, needed outlets are oftentimes out of reach. Also, a power cord is more inconvenient if an appliance needs to be moved often from one location to another. A user must unplug and remove the appliance, avoid tripping over the power cord, then stow and plug in the appliance at a new location. Especially in an automated application, such as in an automated storage and retrieval system, the power cord is impractical. Furthermore, in all circumstances, excess cord must be gathered and stored, which is clumsy and often causes damage to the cord. Finally, cords become tangled, cause safety hazards, and a large mess of cords can be an eye-sore.

Besides the use of power cords, another disadvantage of the current model for appliance use is the method used for storing the appliances. Most appliances require a separate support structure for storage, such as a shelf or work surface. But multiple, oddly shaped appliances clutter counter space if left in convenient locations, and appliances of myriad shapes and sizes with their wrapped-up cords being stuffed onto various shelves is not much better. Furthermore, wall space is underutilized. Superior methods for powering and storing appliances are needed.

Some alternative power connections exist that allow appliances of like size to connect to each other without the use of a power cord, simultaneously providing a support structure for the appliances as well. In these applications, a first appliance is connected to electricity and to a support structure with a power cord, and each subsequent appliance is supported and powered through the first appliance. However, a power cord is still needed, and additional structural and electrical requirements are placed on the appliance that supports other appliances.

In light of the foregoing, what is needed is an appliance that can be independently supported and powered without the use of a power cord, and that can be stored conveniently with other appliances in an organized fashion that allows for easy movement.

SUMMARY OF THE INVENTION

The disclosed invention has been developed in response to the present state of the art and, in particular, in response to the problems and needs in the art that have not yet been fully solved by currently available components and methods. Accordingly, efficient structural components and methods have been developed to allow an appliance to be powered without the use of a power cord and independently supported but easily moved.

Consistent with the foregoing, an apparatus is disclosed. The apparatus comprises an electrically powered appliance and one or more electrically conductive members mounted to the appliance. Each electrically conductive member comprises an insulative housing comprising an opening comprising a first electrical conductor. The first electrical conductor is positioned so as to mate with a second electrical conductor coupled to a source of electrical power within a connector mounted to a wall from which the appliance may be removably suspended. The connector is dimensioned to fit removably inside the opening of the electrically conductive member.

In some embodiments, the appliance is modular. In some embodiments, the apparatus is any one of a variety of kitchen appliances. In some embodiments, the appliance has particular dimensions, and more specifically, the appliance may be dimensioned to fit within a storage and retrieval system. In some embodiments, the apparatus is cordless, but in other embodiments, the appliance comprises an outlet having contacts engageable with contacts of a detachable power cord.

Two or four electrically conductive members may be mounted to the appliance in certain embodiments, some connected to hot wires and some connected to neutral wires. In some embodiments, the electrically conductive members are mounted inside the appliance. In some embodiments, the first and second electrical conductors inside the electrically conductive members and the connectors comprise pins, some of which are spring-loaded, or pins with pin receptacles. In some embodiments, the connectors comprise hooks.

BRIEF DESCRIPTION OF THE DRAWINGS

A more particular description of the invention briefly described above is made below by reference to specific embodiments depicted in drawings included with this application, in which.

DETAILED DESCRIPTION

A detailed description of the claimed invention is provided below by example, with reference to embodiments in the appended figures. Those of skill in the art will recognize that the components of the invention as described by example in the figures below could be arranged and designed in a wide variety of different configurations. Thus, the detailed description of the embodiments in the figures is merely representative of embodiments of the invention, and is not intended to limit the scope of the invention as claimed.

Figure 1:
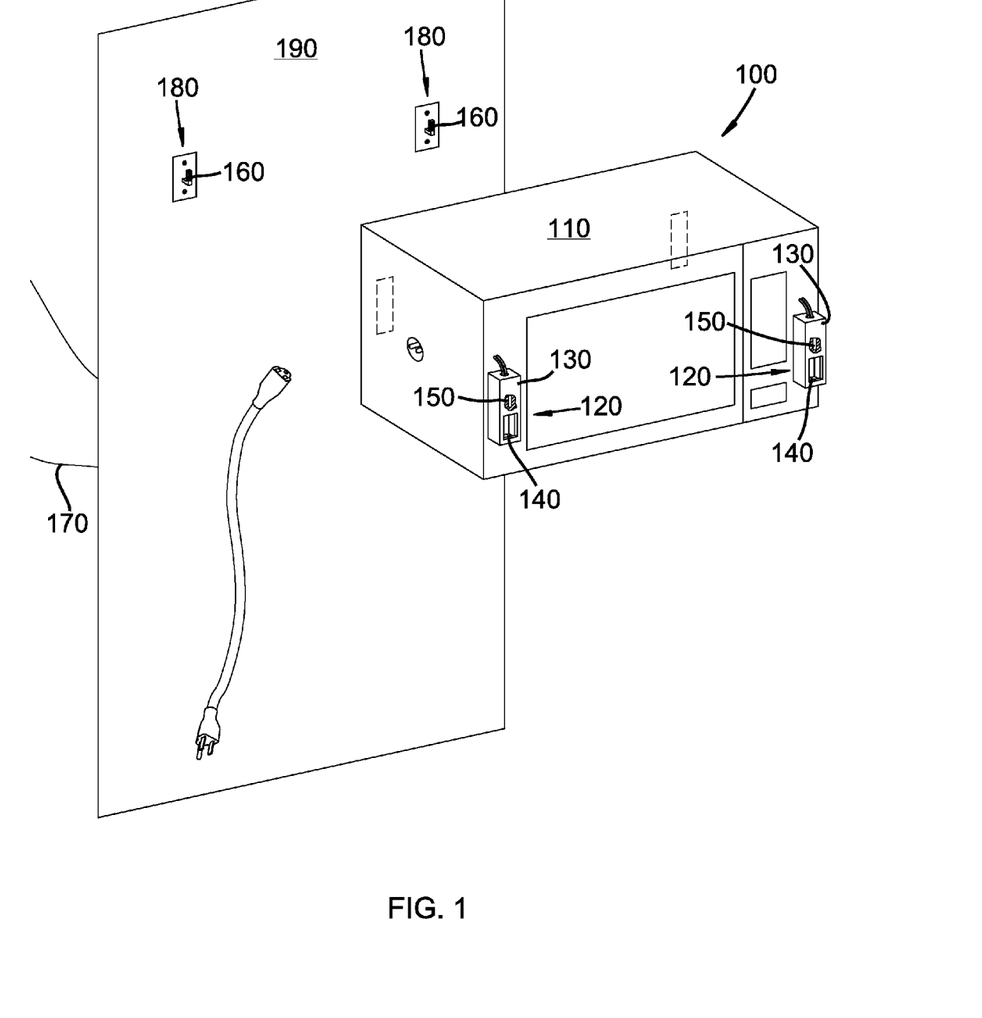
FIG. 1 depicts one embodiment of an apparatus comprising an electrically powered appliance and one or more electrically conductive members mounted to the appliance.

FIG. 1 depicts one embodiment of an apparatus 100 comprising an electrically powered appliance 110 and one or more electrically conductive members 120 mounted to the appliance 110. Each electrically conductive member 120 comprises an insulative housing 130 comprising an opening 140. The opening 140 comprises a first electrical conductor 150 that is positioned so as to mate with a second electrical conductor 160 coupled to a source of electrical power 170 within a connector 180 mounted to a wall 190 from which the appliance 110 may be removably suspended. The connector 180 is dimensioned to fit removably inside the opening 140 of the electrically conductive member 120.

Figure 2A:
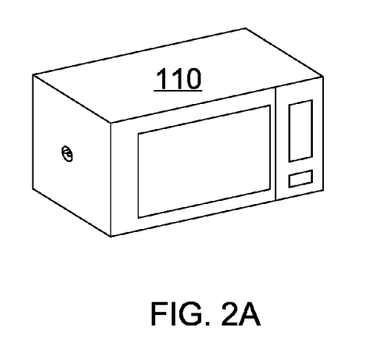
FIG. 2A depicts one embodiment of a microwave.
Figure 2B:
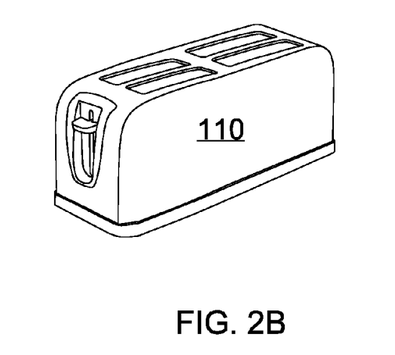
FIG. 2B depicts one embodiment of a toaster.
Figure 2C:
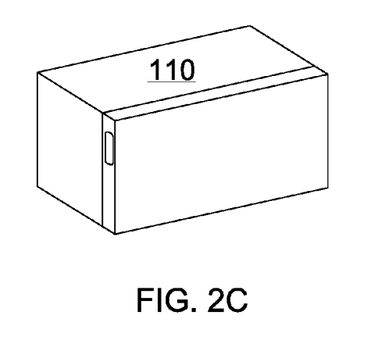
FIG. 2C depicts one embodiment of a refrigerator.
Figure 2D:
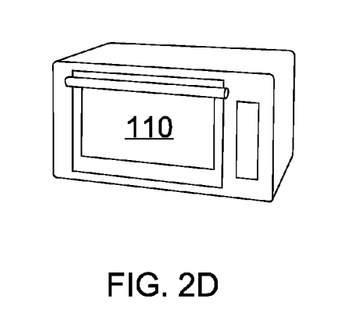
FIG. 2D depicts one embodiment of an oven.

FIG. 2A-FIG. 2D depict embodiments of an electrically powered appliance 110. In some embodiments, the appliance 110 is selected from the group consisting of microwaves, refrigerators, ice machines, heaters, toasters, mixers, ovens, juicers, dryers, grinders, dispensers, freezers, gas and electric cook tops, gas and electric ranges, bread machines, humidifiers, and grills. FIG. 2A depicts one embodiment of a microwave. FIG. 2B depicts one embodiment of a toaster. FIG. 2C depicts one embodiment of a refrigerator. FIG. 2D depicts one embodiment of an oven. Other embodiments may comprise other electrically powered appliances. In one embodiment, the appliance 110 is modular. In other words, multiple appliances 110 would all be shaped in a matching configuration. In a preferred embodiment, the appliance 110 comprises a rectangular prismatic configuration. In one embodiment, the appliance 110 is dimensioned to fit within an automated storage and retrieval system. In one embodiment, the appliance 110 measures approximately twelve inches (30.48 cm.) tall. In one embodiment, the appliance 110 measures approximately twelve inches (30.48 cm.) deep. In one embodiment, the appliance 110 measures approximately twenty inches (50.8 cm.) wide. In a preferred embodiment, the appliance 100 measures approximately twelve inches (30.48 cm.) tall, twelve inches (30.48 cm.) deep, and twenty inches (50.8 cm.) wide. In one embodiment, the appliance 110 weighs not more than approximately 20 pounds (9.07 kilograms).

Figure 3A:
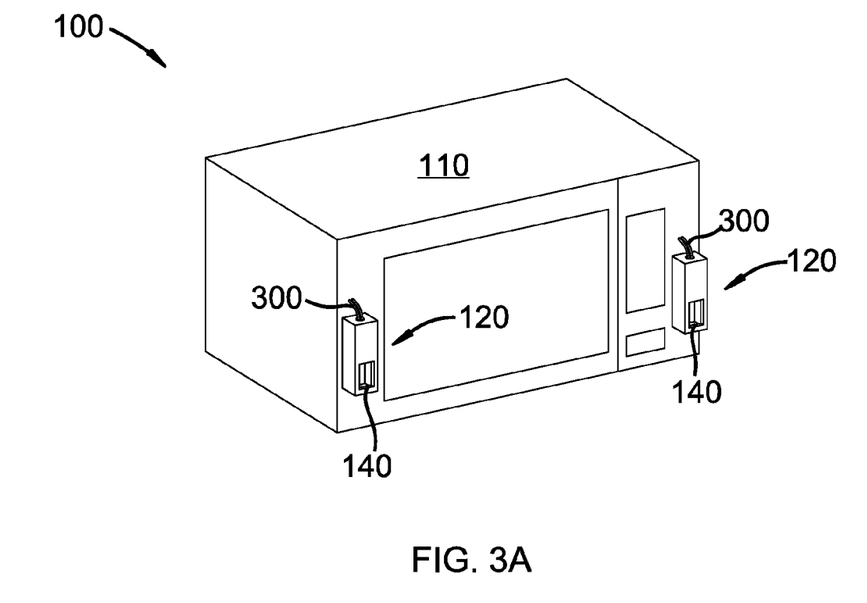
FIG. 3A depicts one embodiment of the one or more electrically conductive members mounted on the outside of the appliance.
Figure 3B:
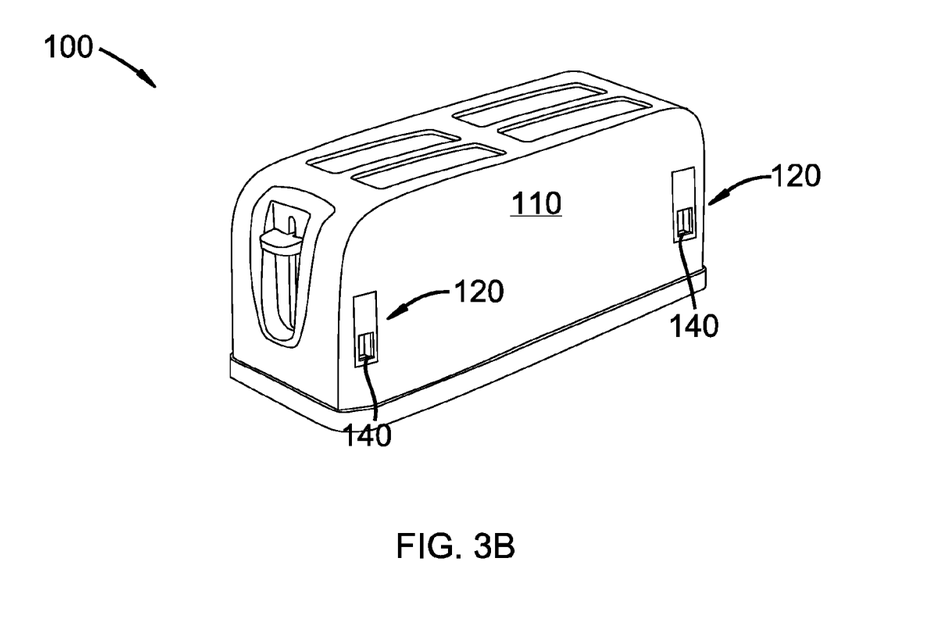
FIG. 3B depicts one embodiment of the one or more electrically conductive members mounted on the inside of the appliance.

FIG. 3A-FIG. 3B depict embodiments of the one or more electrically conductive members 120 mounted to the appliance 110. In a preferred embodiment, two electrically conductive members 120 are mounted to the appliance 110. Preferably, one electrically conductive member 120 is connected to hot wires and a second electrically conductive member 120 is connected to neutral wires inside the appliance, allowing for a complete electrical circuit. In another embodiment, just one electrically conductive member 120 is connected to both hot wires and neutral wires. In another embodiment, four electrically conductive members 120 are mounted to the appliance 110, with two electrically conductive members 120 on a front side of the appliance 110 and two electrically conductive members 120 on a back side of the appliance 110. This embodiment allows the apparatus 100 to be suspended from a wall 190 from either a front side or a back side of the appliance 110. This is especially useful if the appliance 110 is being shuffled through an automated storage and retrieval system. The one or more electrically conductive members 120 can be mounted in a variety of ways. In one embodiment, the one or more electrically conductive members 120 are mounted to the outside of the appliance 110, such that the one or more electrically conductive members 120 protrude from the appliance 110. FIG. 3A depicts this embodiment. In this embodiment, electrical wires 300 extend from a first electrical conductor 150 inside the one or more electrically conductive members 120 into the appliance 110, seen or unseen, to provide the appliance 110 with electrical power. Preferably, hot electrical wires extend from the first electrical conductor 150 inside one electrically conductive member 120, and neutral electrical wires extend from the first electrical conductor 150 inside a second electrically conductive member 120 mounted to the appliance 110, such that a complete electrical circuit is created between the two electrically conductive members 120 that are mounted to the appliance 110. In another embodiment, the one or more electrically conductive members 120 are mounted to the inside of the appliance 110, such that only the opening 140 is visible from an outside view of the appliance 110. This embodiment is depicted in FIG. 3B. In this embodiment, electrical wires 300 extend from the first electrical conductor 150 inside the one or more electrically conductive members 120 into the appliance 110, unseen, connecting the appliance 110 to electrical power. Again, preferably hot electrical wires extend from the first electrical conductor 150 inside one electrically conductive member 120, and neutral electrical wires extend from the first electrical conductor 150 inside a second electrically conductive member 120 mounted to the appliance 110, such that a complete electrical circuit is created between the two electrically conductive members 120 that are mounted to the appliance 110.

Figure 4A:
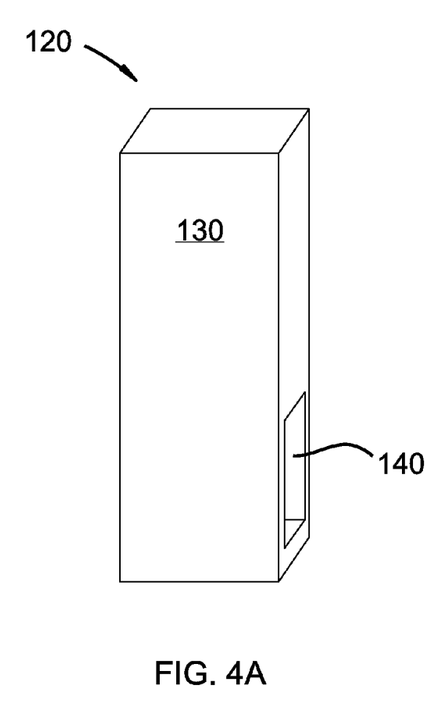
FIG. 4A depicts an exterior view of one embodiment of the one or more electrically conductive members.
Figure 4B:
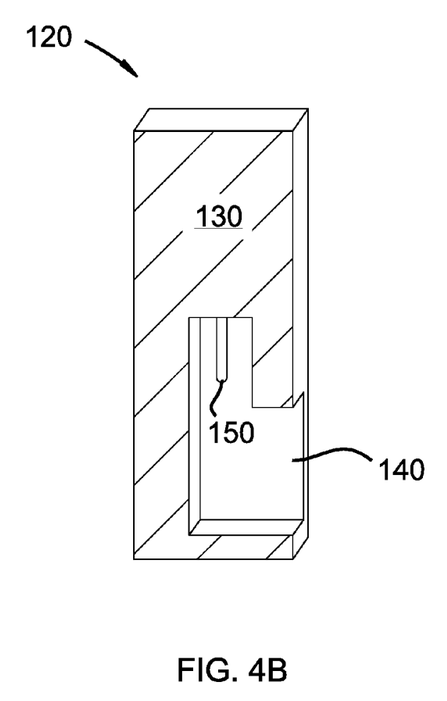
FIG. 4B depicts an interior view of one embodiment of the one or more electrically conductive members.

FIG. 4A and FIG. 4B depict views of embodiments of the one or more electrically conductive members 120. FIG. 4A depicts an exterior view. FIG. 4B depicts an interior view. In one embodiment, the one or more electrically conductive members are that which are described in patent specification U.S. Ser. No. 15/277,090, Electrically Conductive Wall Hooks, which is commonly owned by the Applicant and incorporated by reference for all that it teaches. The one or more electrically conductive members 120 comprise an insulative housing 130. In different embodiments, the insulative housing 130 comprises plastic or rubber. The preferred embodiment comprises plastic. In a preferred embodiment, the insulative housing 130 comprises a rectangular prismatic configuration. Other embodiments comprise other configurations. In a preferred embodiment, the insulative housing 130 measures approximately 1.5 inches (3.81 cm.) high by 0.3 inches (0.76 cm.) wide by 0.5 inches (1.27 cm.) deep. The insulative housing 130 comprises an opening 140, which comprises a first electrical conductor 150. In a preferred embodiment, the first electrical conductor 150 comprises a pin. In one embodiment, the pin is a spring-loaded pin. The flexibility of a spring-loaded pin ensures that the pin will establish a secure electrical connection. In another embodiment, the first electrical conductor 150 comprises a receptacle. The first electrical conductor 150 is positioned so as to mate with a second electrical conductor 160 coupled to a source of electrical power 170 within a connector 180 mounted to a wall 190 from which the appliance 110 may be removably suspended. The connector 180 is dimensioned to fit removably inside the opening 140 of the electrically conductive member 120. For that reason, in a preferred embodiment, the opening 140 is shaped like a hook.

Figure 5:
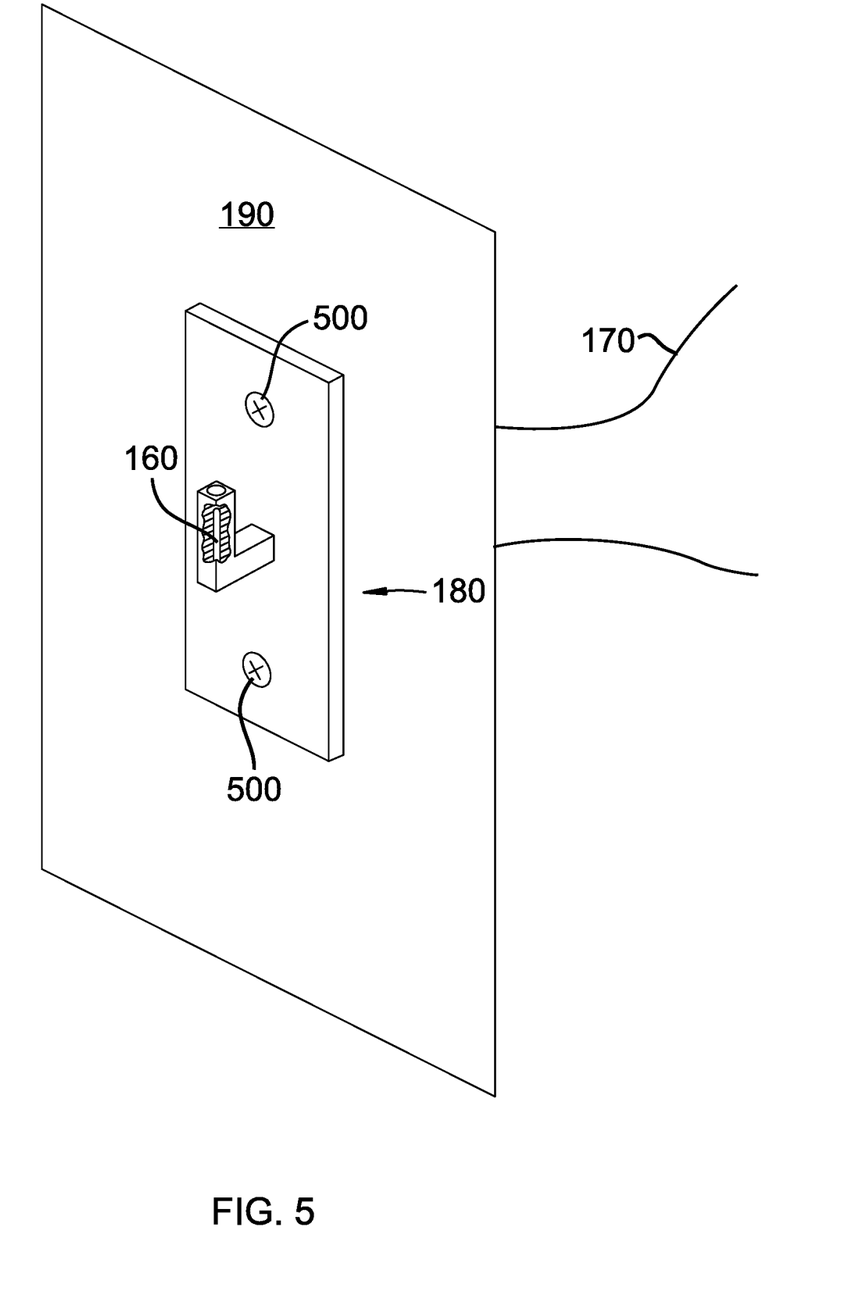
FIG. 5 depicts one embodiment of a connector.

FIG. 5 depicts one embodiment of a connector 180. In one embodiment, the connector is that which is described in patent specification U.S. Ser. No. 15/277,090, Electrically Conductive Wall Hooks, which is commonly owned by the Applicant and incorporated by reference for all that it teaches. The connector 180 is mounted to a wall 190 from which the appliance 110 may be removably suspended. In one embodiment, the connector is mounted to the wall with fasteners 500, comprising screws, nails, bolts, rivets, pins, sockets, or anchors. In a preferred embodiment, the connector 180 comprises a hook. The connector 180 is dimensioned to fit removably inside the opening 140 of the one or more electrically conductive members 120. The appliance 110 may be removably suspended from the wall 190 when the connector 180 is fitted removably inside the opening 140 of the one or more electrically conductive members 120 mounted to the appliance 110. In one embodiment, the connector 180 comprises an insulating material, preferably plastic. In one embodiment, the connector 180 protrudes from the wall 190 at a ninety-degree angle. In one embodiment, the connector 180 supports twenty pounds (9.07 kilograms) of weight. Furthermore, within the connector 180 is a second electrical conductor 160 that is coupled to a source of electrical power 170. The second electrical conductor 160 is positioned so as to mate with the first electrical conductor 150 when the connector 180 is fitted removably inside the opening 140 of the one or more electrically conductive members 120. In a preferred embodiment, the second electrical conductor 160 comprises a pin. In one embodiment, the pin comprises a spring-loaded pin. The flexibility of a spring-loaded pin ensures that the pin will establish a secure electrical connection. In another embodiment, the second electrical conductor 160 comprises a receptacle. In a preferred embodiment, the source of electrical power that is coupled to the second electrical conductor 160 is located inside the wall 190. In one embodiment, the source of electrical power 170 comprises electrical wires, at least one hot and one neutral. In a preferred embodiment, two electrically conductive members 120 are mounted to each appliance 110. These two electrically conductive members 120 align with two connectors 180 mounted to the wall 190. In this preferred embodiment, hot electrical wires extend to the second electrical conductor 160 inside one connector 180, and neutral electrical wires extend to the second electrical conductor 160 inside a second connector 180. This allows a complete electrical circuit to be created extending from the source of electrical power 170. In one embodiment, the wall 190 to which each connector 180 is mounted comprises two metal rails, such as busbars, one wired to be hot and the other one wired to be neutral. The connectors 180 are mounted on these rails. In one embodiment, the source of electrical power 170 is equipped with a ground fault circuit interrupter (GFCI).

Figure 6:
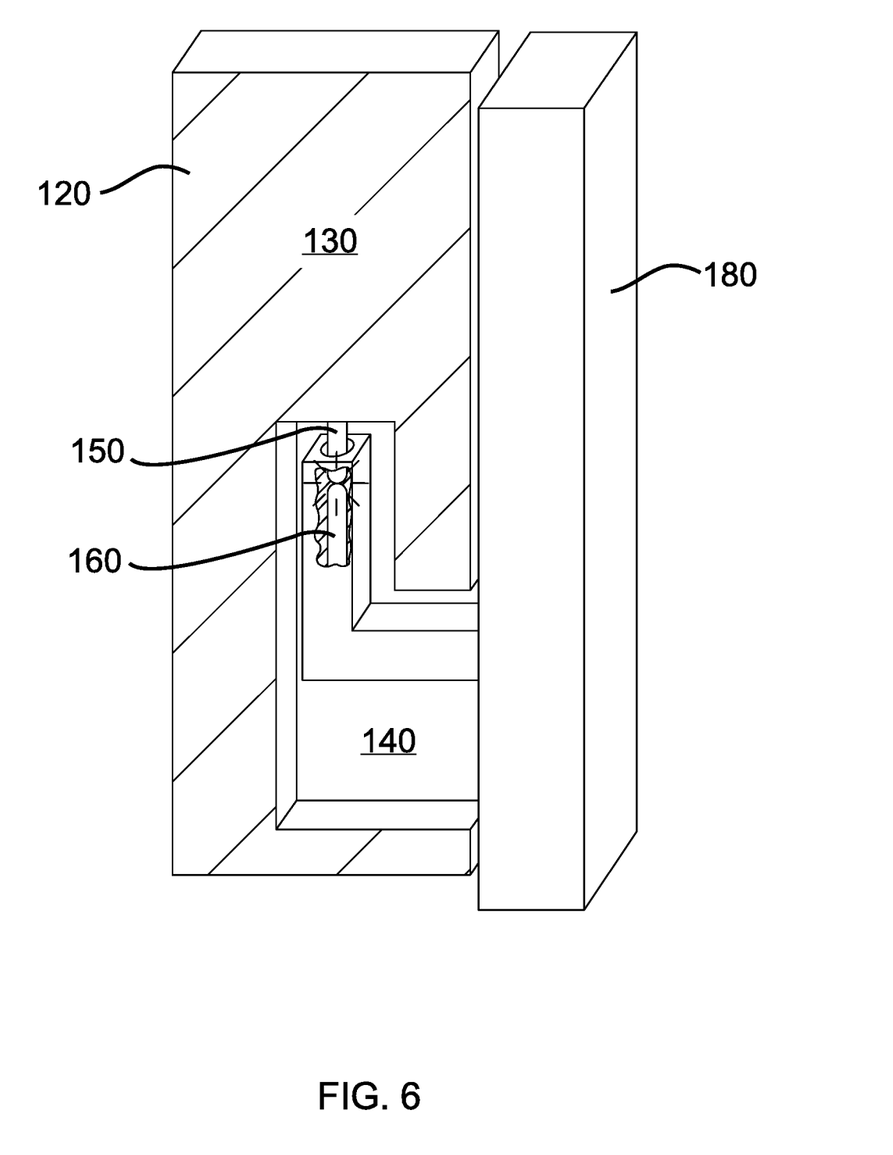
FIG. 6 depicts one embodiment of the connector fitted removably inside the opening of the one or more electrically conductive members and the first electrical conductor and the second electrical conductor positioned so as to mate when the connector is fitted removably inside.

FIG. 6 depicts one embodiment of the connector 180 fitted removably inside the opening 140 of the one or more electrically conductive members 120 and the first electrical conductor 150 and the second electrical conductor 160 positioned so as to mate when the connector 180 is fitted removably inside. The connector 180 is dimensioned to fit removably inside the opening 140. After the connector 180 is inserted into the opening 140, because the opening 140 extends upward beyond the top of the connector 180, the one or more electrically conductive members 120 shift downward until the connector 180 catches the one or more electrically conductive members 120. At that point, the appliance 110 is suspended from the connector 180. Also at that point, the first electrical conductor 150 and the second electrical conductor 160 mate, creating an electrical current, which provides electrical power from the electrical source 170 to which the second electrical conductor 160 is coupled, preferably located inside the wall 190, to the appliance 110, which is suspended from the wall 190 when the connector 180 is fitted removably inside the opening 140. In one embodiment, the first and second electrical conductors 150 and 160 are pins, preferably spring-loaded pins. In another embodiment, the first and second electrical conductors 150 and 160 comprise a pin and a pin receptacle.

Figure 7A:
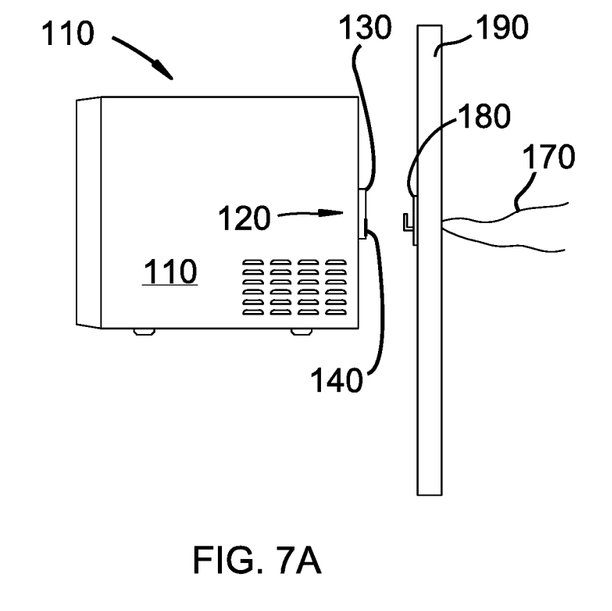
FIG. 7A depicts a side view of one embodiment of the apparatus being suspended from the wall.
Figure 7B:
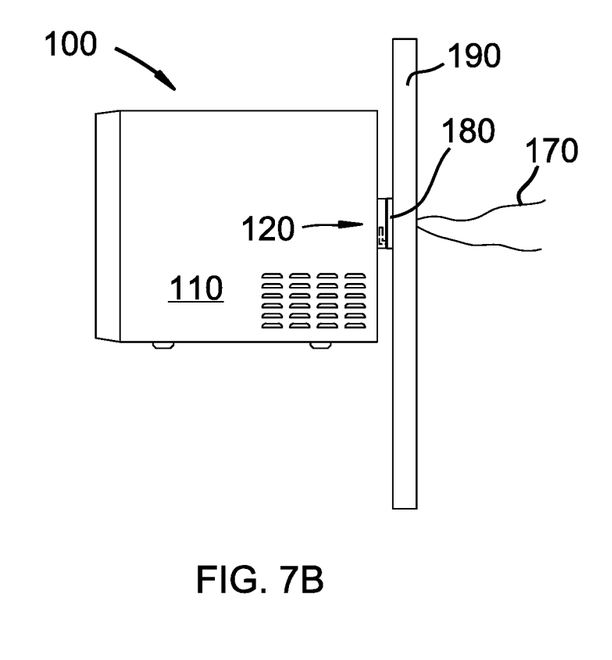
FIG. 7B depicts a side view of one embodiment of the apparatus being suspended from the wall.

FIG. 7A and FIG. 7B depict side views of the apparatus 100 being suspended from the wall 190. FIG. 7A depicts the apparatus 100, comprising one or more electrically conductive members 120 mounted to the appliance 110, and a connector 180 that is mounted to the wall 190. The one or more electrically conductive members 120 comprise an insulative housing 130 comprising an opening 140. The connector 180 is dimensioned to fit removably inside the opening 140. When the connector 180 is fitted removably inside the opening 140, the appliance 110 is suspended from the wall 190, as depicted in FIG. 7B. The one or more electrically conductive members 120 also comprise a first electrical conductor 150. The connector 180 comprises a second electrical conductor 160 that is coupled to a source of electrical power 170. The first electrical conductor 150 and the second electrical conductor 160 are positioned so as to mate when the connector 180 is fitted removably inside the opening 140. In this way, the appliance 110 is provided with electrical power when it is hung on the wall 190, without the need for other outlets or plugs. In a preferred embodiment, the source of electrical power 170 that is coupled to the second electrical conductor 160 is located inside the wall 190. In this embodiment, the source of electrical power 170 comprises electrical wires, one hot and one neutral. In a preferred embodiment, the appliance 110 is suspended from two connectors 180. In this preferred embodiment, hot electrical wires extend to the second electrical conductor 160 inside one connector 180, and neutral electrical wires extend to the second electrical conductor 160 inside a second connector 180. This allows a complete electrical circuit to be created extending from the source of electrical power. In one embodiment, the wall 190 to which each connector 180 is mounted comprises two metal rails, such as busbars, one wired to be hot and the other one wired to be neutral. The connectors 180 are mounted on these rails. In one embodiment, the source of electrical power 170 is equipped with a ground fault circuit interrupter (GFCI).

Figure 8A:
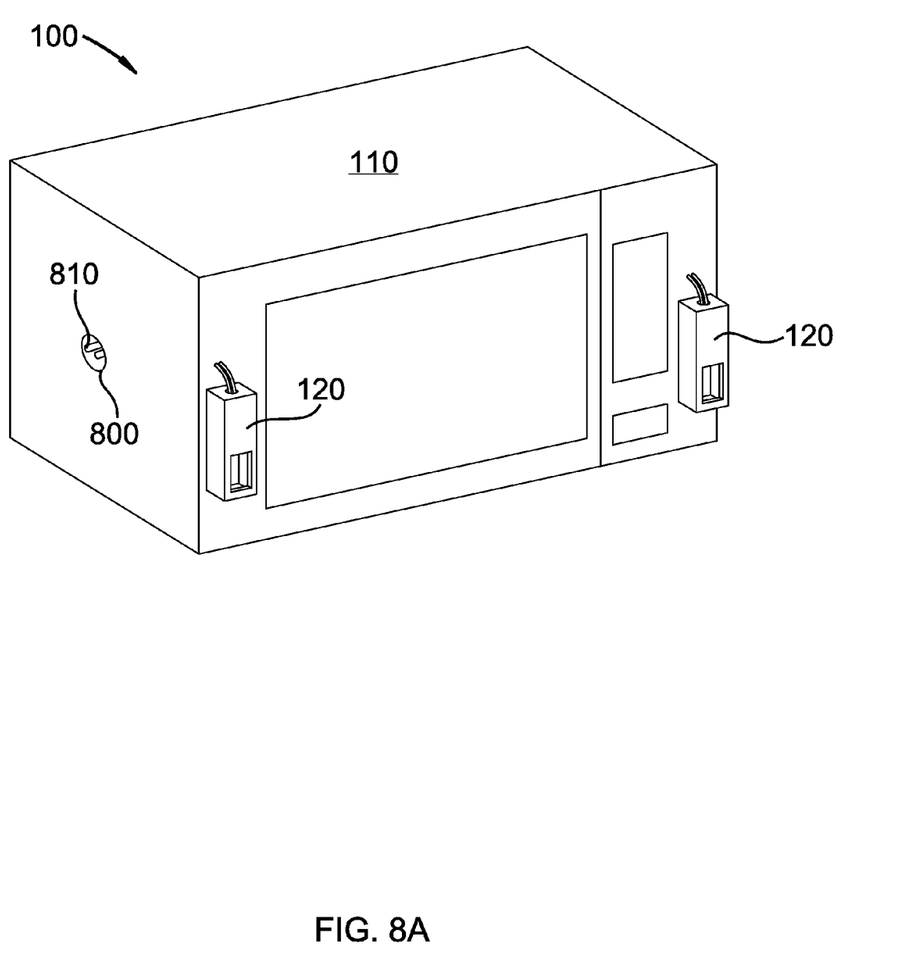
FIG. 8A depicts one embodiment of the apparatus fitted with an outlet.
Figure 8B:
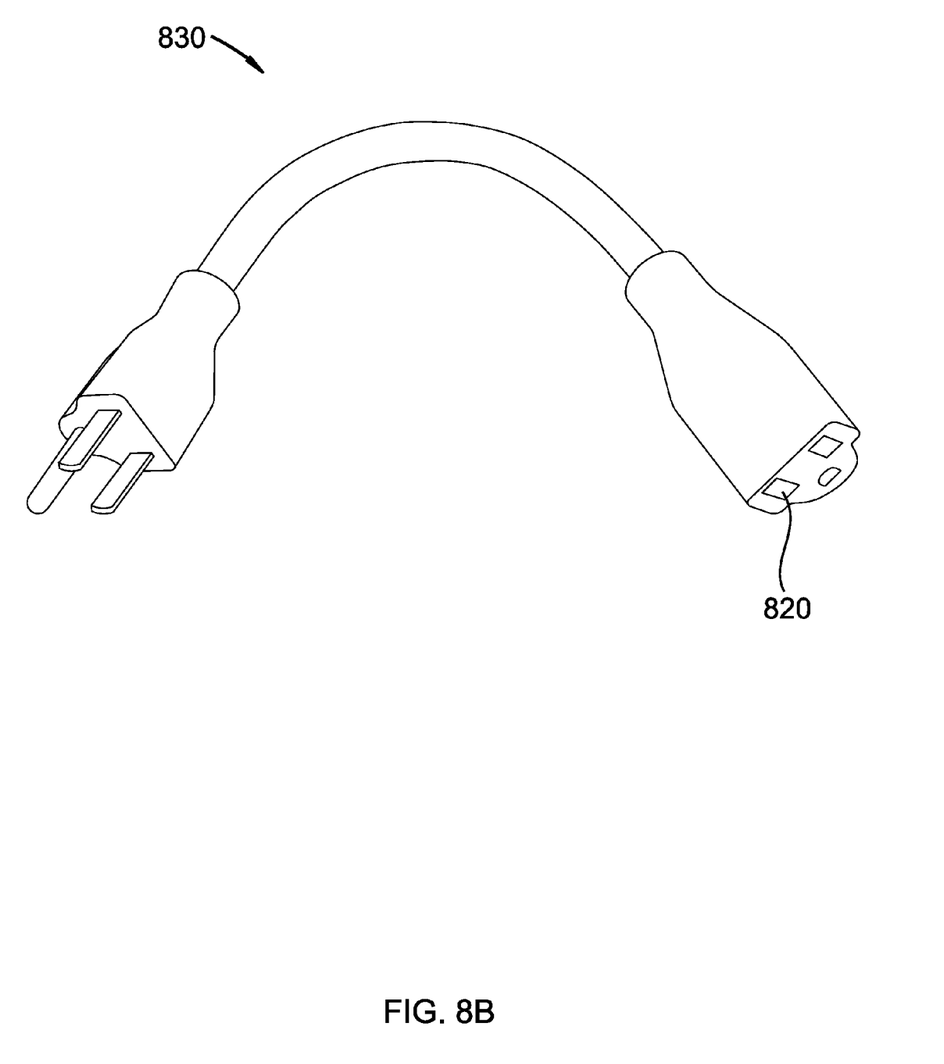
FIG. 8B depicts one embodiment of a detachable power cord.
Figure 8C:
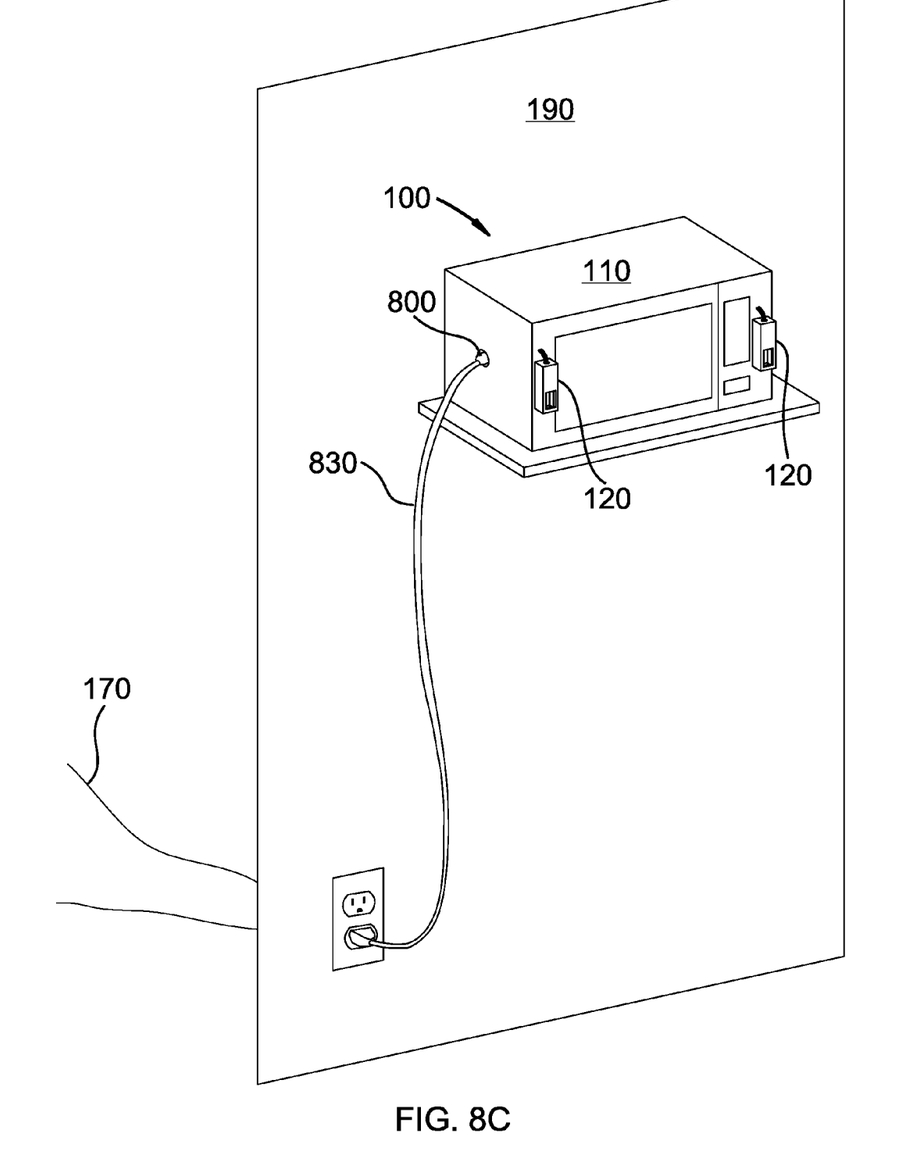
FIG. 8C depicts one embodiment of the apparatus comprising an outlet to which a detachable power cord is attached, the detachable power cord being plugged into the source of electrical power.

FIG. 8A-FIG. 8C depict embodiments of the appliance 110 comprising an outlet 800 having contacts 810 engageable with contacts 820 of a detachable power cord 830 that connects to the source of electrical power 170. The invented apparatus 100 is supplied with electrical power when it is hung on the wall 190 by means of the first electrical conductor 150 inside the one or more electrically conductive members 120 mating with the second electrical conductor 160 inside the connector 180 that is mounted to the wall 190, thus eliminating the need for other outlets or plugs. However, it is possible that in some circumstances, a user might need to use the invented apparatus 100 in a context where a connector 180 is not available. Therefore, the ability to use a traditional outlet and plug would, in some circumstances, be desirable. Therefore, in some embodiments, the appliance 110 comprises an outlet 800 having contacts 810 engageable with contacts 820 of a detachable power cord 830 that connects to the source of electrical power 170. FIG. 8A depicts one embodiment of the apparatus 100 fitted with an outlet 800. FIG. 8B depicts one embodiment of a detachable power cord 830, also known as a pigtail adaptor. FIG. 8C depicts one embodiment of the apparatus 100 comprising an outlet 800 to which a detachable power cord 830 is attached, the detachable power cord 830 being plugged into the source of electrical power 170, providing the apparatus 100 with electrical power. In a preferred embodiment, the source of electrical power 170 is located inside the wall 190. In one embodiment, the source of electrical power 170 comprises electrical wires, one hot and one neutral.

Figure 9:
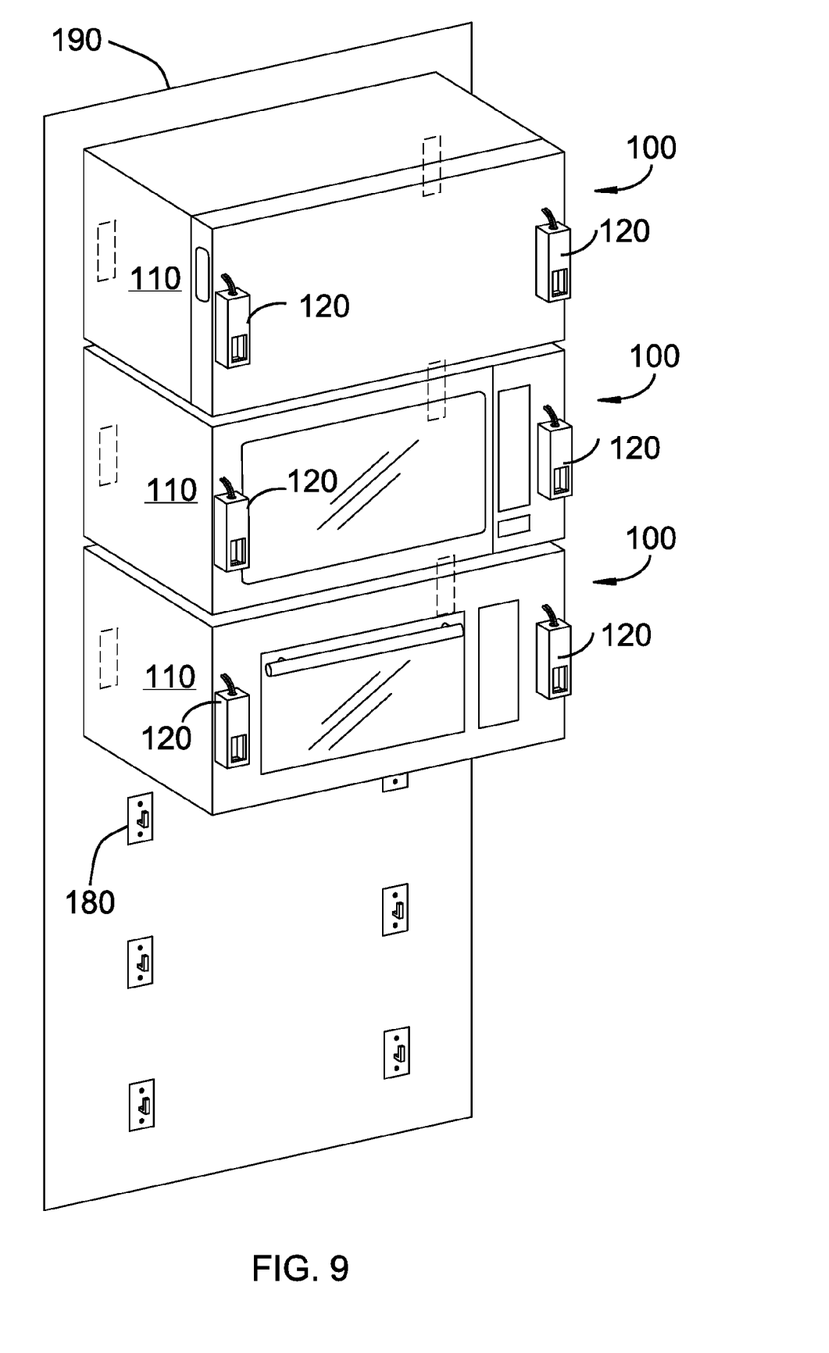
FIG. 9 depicts a front view of several embodiments of the apparatus suspended from a wall.

FIG. 9 depicts a front view of several embodiments of the apparatus 100 suspended from a wall 190. Each apparatus comprises an electrically powered appliance 110 and one or more electrically conductive members 120 mounted to the appliance 110. Each electrically conductive member 120 comprises a first electrical conductor 150. Furthermore, each electrically conductive member 120 corresponds with a connector 180 mounted to the wall 190 from which each appliance 110 is removably suspended. Within each connector 180 is a second electrical conductor 160 coupled to a source of electrical power 170, and each first electrical conductor 150 is positioned so as to mate with the second electrical conductor 160 within each connector 180 when the apparatus 100 is suspended from the wall 190 by means of the connector 180. In this way, each appliance 110 is provided with electrical power when it is hung on the wall 190, without the need for other outlets or plugs, providing not only a convenient way for powering appliances, but also an optimal utilization of space. Furthermore, because each appliance may be modular, with a similar shape and size, appliances may be neatly lined up along a wall, which is convenient, orderly, and aesthetically pleasing, far superior to dealing with tangled up cords, lack of counter space, or constant moving of the appliance in and out of storage.

Figure 10:
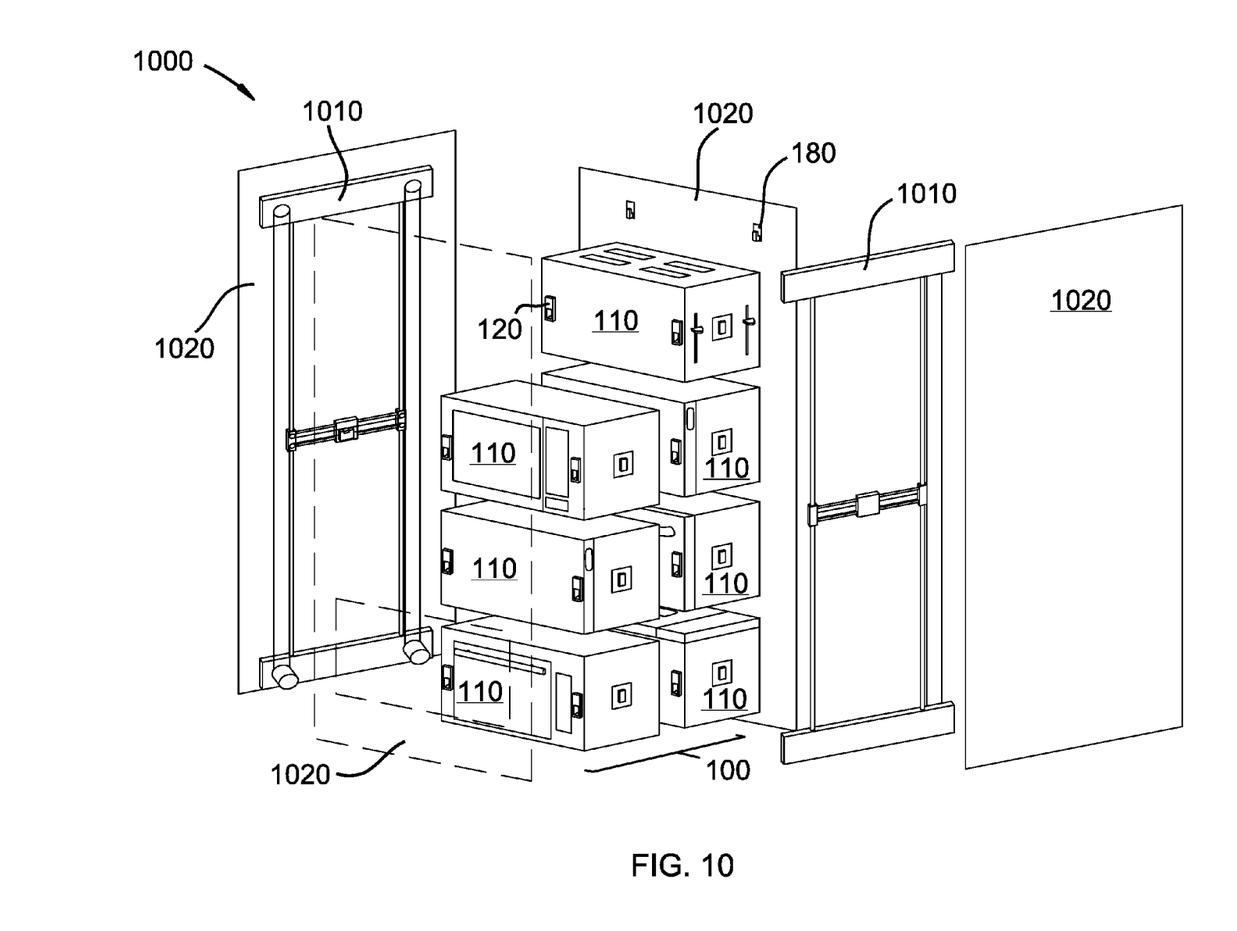
FIG. 10 depicts embodiments of the apparatus utilized in an automated storage and retrieval system.

FIG. 10 depicts embodiments of the apparatus 100 utilized in an automated storage and retrieval system 1000. The apparatus 100 comprises an appliance 110, and in one embodiment, the appliance 110 is dimensioned to fit within an automated storage and retrieval system 1000. In a preferred embodiment, the appliance measures approximately twelve inches tall, twelve inches deep, and twenty inches wide, which is the perfect set of dimensions for fitting inside a storage and retrieval system 1000. In one embodiment, the appliance 110 is modular. Each modular appliance 110 would fit inside the same automated storage and retrieval system 1000. In different embodiments, the automated storage and retrieval system is that which is described in Automatic Storage and Retrieval System with Planar Motion Mechanism, patent specification U.S. Ser. No. 15/248,589; Automated Storage and Retrieval Direct Movement Method, patent specification U.S. Ser. No. 15/260,979; or Automated Storage and Retrieval System with Retractable Mountings, patent specification U.S. Ser. No. 15/278,545, which are commonly owned by the Applicant and incorporated by reference for all that they teach. In one embodiment, the storage and retrieval system 1000 comprises one or more planar motion mechanisms 1010 movably mounted to a frame 1020, the one or more planar motion mechanisms preferably being H-bots. The storage and retrieval system 1000 further comprises one or more of the connectors 180 mounted to one or more walls of the frame 1020. Suspended from each set of two of the connectors 180 is one embodiment of the apparatus 100 comprising an appliance 110 and one or more electrically conductive members 120. The one or more planar motion mechanisms 1010 suspend positionable objects, in this case embodiments of the apparatus 100, from one or more of the connectors 180 and reposition the positionable objects, in this case embodiments of the apparatus 100, within the frame 1020. A first electrical conductor 150 and a second electrical conductor 160 (not pictured in FIG. 10) mate when each apparatus 100 is suspended by means of a connector 180, connecting each apparatus 100 to electrical power while suspended from the connectors 180. Using the invented apparatus 100 in an automated storage and retrieval system 1000 allows appliances to be connected to electrical power during storage, without regard for where the appliance is moved within the storage area. For example, if a bread machine were built in accordance with the invention, a user could add ingredients to the bread machine and instruct the bread machine to start a bread making cycle. While the cycle was underway, the bread machine would require little to no monitoring by the user, but it would require electrical power. The user could insert the bread machine into the automated storage and retrieval system 1000. As the bread machine was stored, it would have a nearly continuous supply of electrical power that would enable the bread machine to complete the bread making cycle even while being stored and moved around within the automated storage and retrieval system 1000. The same would be true of a refrigerator or an oven. The same would not be true if these appliances were powered by means of power cords. Therefore, this is one preferred application of the present invention, but many other applications also exist.

The invention claimed is:

1. An apparatus comprising:
   an electrically powered appliance; and
   at least two electrically conductive members mounted to the appliance, each electrically conductive members comprising:
      an insulative housing comprising an opening comprising a first electrical conductor that is positioned so as to mate with a second electrical conductor coupled to a source of electrical power within a connector mounted to a wall from which the appliance may be removably suspended, the connector dimensioned to fit removably inside the opening of the electrically conductive member.

2. The apparatus of claim 1, wherein the appliance is modular.

3. The apparatus of claim 1, wherein the appliance is dimensioned to fit within an automated storage and retrieval system.

4. The apparatus of claim 3, wherein the automated storage and retrieval system comprises one or more planar motion mechanisms movably mounted to a frame and one or more of the connectors mounted to one or more walls of the frame, and wherein the one or more planar motion mechanisms suspend positionable objects from one or more of the connectors and reposition the positionable objects within the frame.

5. The apparatus of claim 4, wherein the one or more planar motion mechanisms are H-bots.

6. The apparatus of claim 1, wherein the appliance measures approximately twelve inches (30.48 cm.) tall.

7. The apparatus of claim 1, wherein the appliance measures approximately twelve inches (30.48 cm.) deep.

8. The apparatus of claim 1, wherein the appliance measures approximately twenty inches (50.8 cm.) wide.

9. The apparatus of claim 1, wherein the appliance is selected from the group consisting of microwaves, refrigerators, ice machines, heaters, toasters, mixers, ovens, juicers, dryers, grinders, dispensers, freezers, gas and electric cook tops, gas and electric ranges, bread machines, humidifiers, and grills.

10. The apparatus of claim 1, wherein the appliance is a cordless appliance.

11. The apparatus of claim 1, wherein the appliance comprises an outlet having contacts engageable with contacts of a detachable power cord that connects to the source of electrical power.

12. The apparatus of claim 1, wherein the first and second electrical conductors comprise pins.

13. The apparatus of claim 12, wherein the pins comprise spring-loaded pins.

14. The apparatus of claim 1, wherein the first and second electrical conductors comprise a pin and a pin receptacle.

15. The apparatus of claim 1, wherein the connector comprises a hook.

16. The apparatus of claim 1, wherein a first electrically conductive member of the at least two electrically conductive members is connected to an electrically hot wire inside the appliance and a second electrically conductive member of the at least two electrically conductive members is connected to an electrically neutral wire inside the appliance.

17. The apparatus of claim 1, wherein the at least two electrically conductive members comprise four electrically conductive members.

18. The apparatus of claim 1, wherein the at least two electrically conductive members are mounted to the inside of the appliance, such that only the respective openings are visible from an outside view of the appliance.

19. The apparatus of claim 1, wherein each of the at least two electrically conductive members measure approximately 1.5 inches (3.81 cm.) high by 0.3 inches (0.76 cm.) wide by 0.5 inches (1.27 cm.) deep.

* * * * *